(12) United States Patent
Fujii et al.

(10) Patent No.: US 9,826,654 B2
(45) Date of Patent: Nov. 21, 2017

(54) DISPLAY

(71) Applicant: Saturn Licensing LLC, New York, NY (US)

(72) Inventors: Hiroaki Fujii, Kanagawa (JP); Shinpei Nagatani, Kanagawa (JP); Takefumi Ikenoya, Tokyo (JP); Hiroaki Yokota, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 0 days.

(21) Appl. No.: 13/908,329

(22) Filed: Jun. 3, 2013

(65) Prior Publication Data

US 2013/0329162 A1 Dec. 12, 2013

(30) Foreign Application Priority Data

Jun. 11, 2012 (JP) ................................. 2012-132110

(51) Int. Cl.
*G02F 1/1333* (2006.01)
*H05K 7/14* (2006.01)
*G09F 9/30* (2006.01)
*G09F 15/00* (2006.01)

(52) U.S. Cl.
CPC ......... *H05K 7/14* (2013.01); *G02F 1/133385* (2013.01); *G09F 9/301* (2013.01); *G09F 15/0012* (2013.01); *G09F 15/0018* (2013.01); *G09F 15/0031* (2013.01); *G02F 2001/133314* (2013.01)

(58) Field of Classification Search
None
See application file for complete search history.

(56) References Cited

U.S. PATENT DOCUMENTS

| 7,834,962 B2 * | 11/2010 | Satake et al. ................ 349/110 |
| 7,920,223 B2 | 4/2011 | Nishizawa et al. |
| 2005/0265048 A1 | 12/2005 | Wang et al. |
| 2006/0044744 A1 | 3/2006 | Kim et al. |
| 2009/0128732 A1 * | 5/2009 | Hamada ............... G02B 6/0068 349/58 |
| 2010/0066937 A1 * | 3/2010 | Yamashita et al. ............. 349/58 |
| 2011/0085107 A1 * | 4/2011 | Noh ..................... G02B 6/0085 349/61 |

(Continued)

FOREIGN PATENT DOCUMENTS

| CN | 101344651 A | 1/2009 |
| CN | 201421691 Y | 3/2010 |

(Continued)

OTHER PUBLICATIONS

Chinese Office Action for Application No. 201310186256.1 dated Jun. 17, 2016.

(Continued)

*Primary Examiner* — Richard Kim
(74) *Attorney, Agent, or Firm* — Lerner, David, Littenberg, Krumholz & Mentlik, LLP

(57) ABSTRACT

A display includes: a plate member having flexibility and including a first face and a second face that face each other; a frame member provided on the first face of the plate member and extending in one direction of the first face; and a display body having flexibility and disposed on a side of the plate member on which the second face is provided.

12 Claims, 21 Drawing Sheets

(56) References Cited

U.S. PATENT DOCUMENTS

| | | | | |
|---|---|---|---|---|
| 2012/0014135 A1* | 1/2012 | Kim | ................. | G02F 1/133615 |
| | | | | 362/623 |
| 2012/0281367 A1* | 11/2012 | He et al. | ....................... | 361/728 |
| 2012/0287368 A1* | 11/2012 | Que | ..................... | G02B 6/0086 |
| | | | | 349/58 |
| 2014/0022487 A1* | 1/2014 | Wang | ................. | G02F 1/133308 |
| | | | | 349/58 |

FOREIGN PATENT DOCUMENTS

| | | |
|---|---|---|
| CN | 101915999 A | 12/2010 |
| JP | 62105185 A | 5/1987 |
| JP | 2004288570 A | 10/2004 |
| JP | 2005-331872 A | 12/2005 |
| JP | 2006064911 A | 3/2006 |
| JP | 2009020168 A | 1/2009 |
| JP | 2009210882 A | 9/2009 |
| JP | 2012093490 A | 5/2012 |
| JP | 2012132110 A | 7/2012 |
| TW | 350066 | 2/2009 |
| WO | 2012006799 A1 | 1/2012 |
| WO | 2013094933 A1 | 6/2013 |

OTHER PUBLICATIONS

Communication pursuant to Article 94(3) ERC EP Application No. 13168643.8, dated Feb. 23, 2016.
Japanese Office Action for Application No. 2012-132110 dated Mar. 22, 2016.
European Search Report from EP Application No. 13168643, dated Sep. 1, 2014.
Chinese Office Action (English translation only), for Application No. 201310186256.1, dated Feb. 28, 2017.

* cited by examiner

DISPLAY

CROSS-REFERENCE TO RELATED APPLICATION

The present application claims priority from Japanese Patent Application No. JP 2012-132110 filed in the Japanese Patent Office on Jun. 11, 2012, the entire content of which is incorporated herein by reference.

BACKGROUND

The present disclosure relates to a display suitable for large televisions and the like.

While a display typically has a planar screen, curvature deformation of a screen into a circular arc shape is also proposed. For example, Japanese Unexamined Patent Application Publication No. 2005-331872 discloses a technology for curvature deformation of a display body in which a screw shaft is penetrated in a right side plate of the display body while a cylindrical bar is fixed to a left side plate thereof, and the distal end of the screw shaft is advanced in the cylindrical bar by rotating an operation screw so as to bring the left and right side plates of the display body close to each other for the curvature deformation of the display body.

SUMMARY

However, display bodies are provided with various structural objects such as a circuit and a display element, and the stiffness of the display bodies is not necessarily uniform over a display screen. Therefore, merely bringing the left and right side plates of the display body close to each other as disclosed in Japanese Unexamined Patent Application Publication No. 2005-331872 may cause buckling of the display body, thus leading to degradation of image quality.

It is desirable to provide a display that allows a display body to have any desired shape.

A display according to an embodiment of the present disclosure includes: a plate member having flexibility and including a first face and a second face that face each other; a frame member provided on the first face of the plate member and extending in one direction of the first face; and a display body having flexibility and disposed on a side of the plate member on which the second face is provided.

The display according to the above-described embodiment of the present disclosure includes the frame member provided on the first face of the flexible plate member. The frame member extends in one direction in the first face of the plate member. The flexible display body is disposed on the second face side of the plate member. Therefore, in the extending direction of the frame member, the plate member may have a shape same as a shape of a side or a face, which faces the plate member, of the frame member, and the display body may have a shape following the plate member. For example, when the side or the face of the frame member facing the plate member is configured to have a shape curved or bent in the extending direction of the frame member, the plate member accordingly has a curved or a bent shape, and the display body also has a curved or a bent shape following the plate member.

In the display according to the above-described embodiment of the present disclosure, the frame member extending in one direction is provided on the first face of the plate member having flexibility, and the display body having flexibility is disposed on the second face side of the plate member. Consequently, it is possible to allow the plate member and the display body to have any desired shape by adjusting the shape of the side or the face of the frame member facing the plate member.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, an embodiment of the present disclosure will be described in detail with reference to the drawings. It is to be noted that description will be made in the following order.

1. Embodiment (an example of a liquid crystal display)
2. Modification 1 (a modification of a variable mechanism and shapes of frame members 50, a plate member 40, and a liquid crystal panel 11)
3. Modification 2 (an example of an organic EL display)

Figure 1:
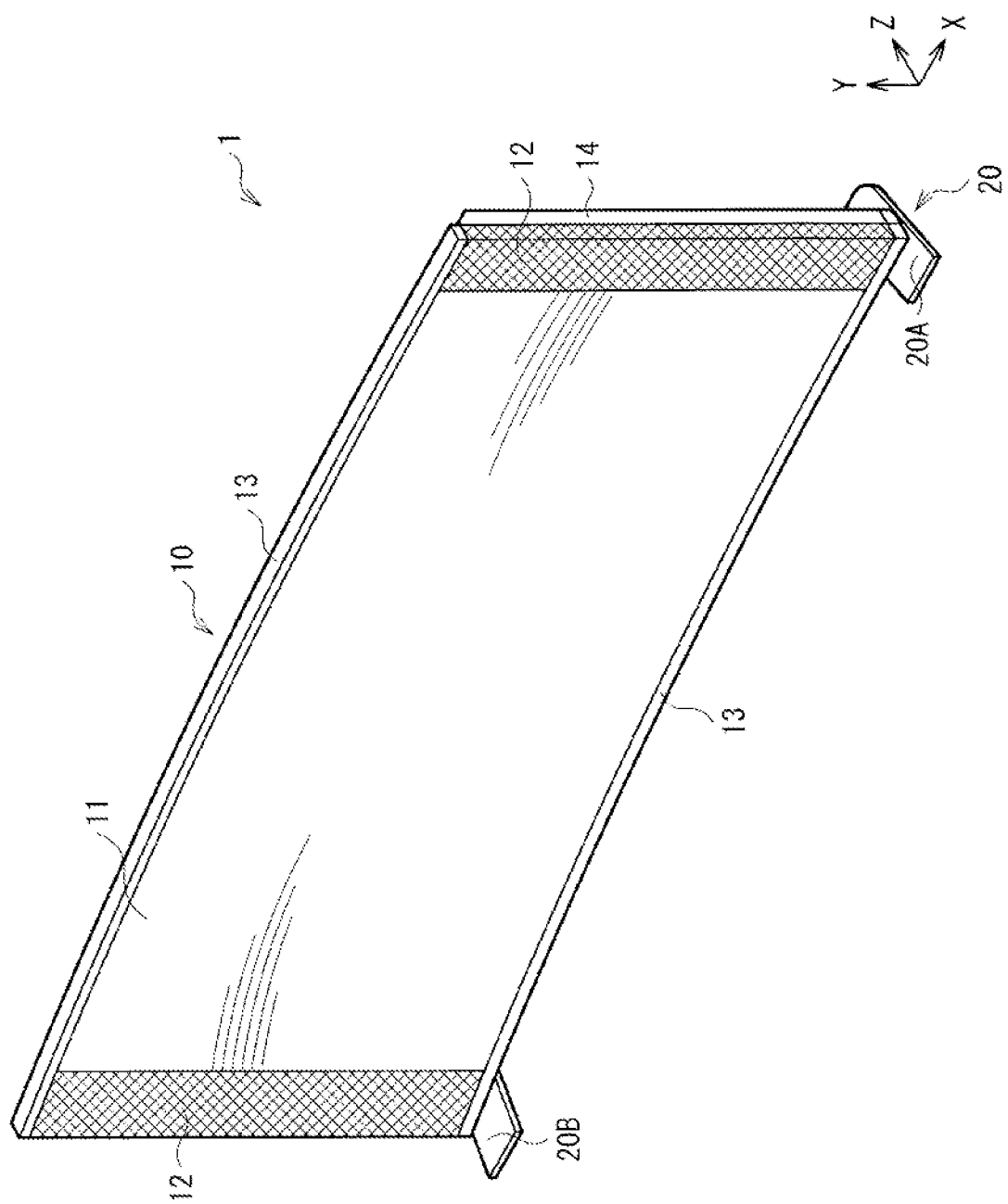
FIG. 1 is a perspective view showing an exemplary external appearance of a display according to an embodiment of the present disclosure as viewed from a front side.
Figure 2:
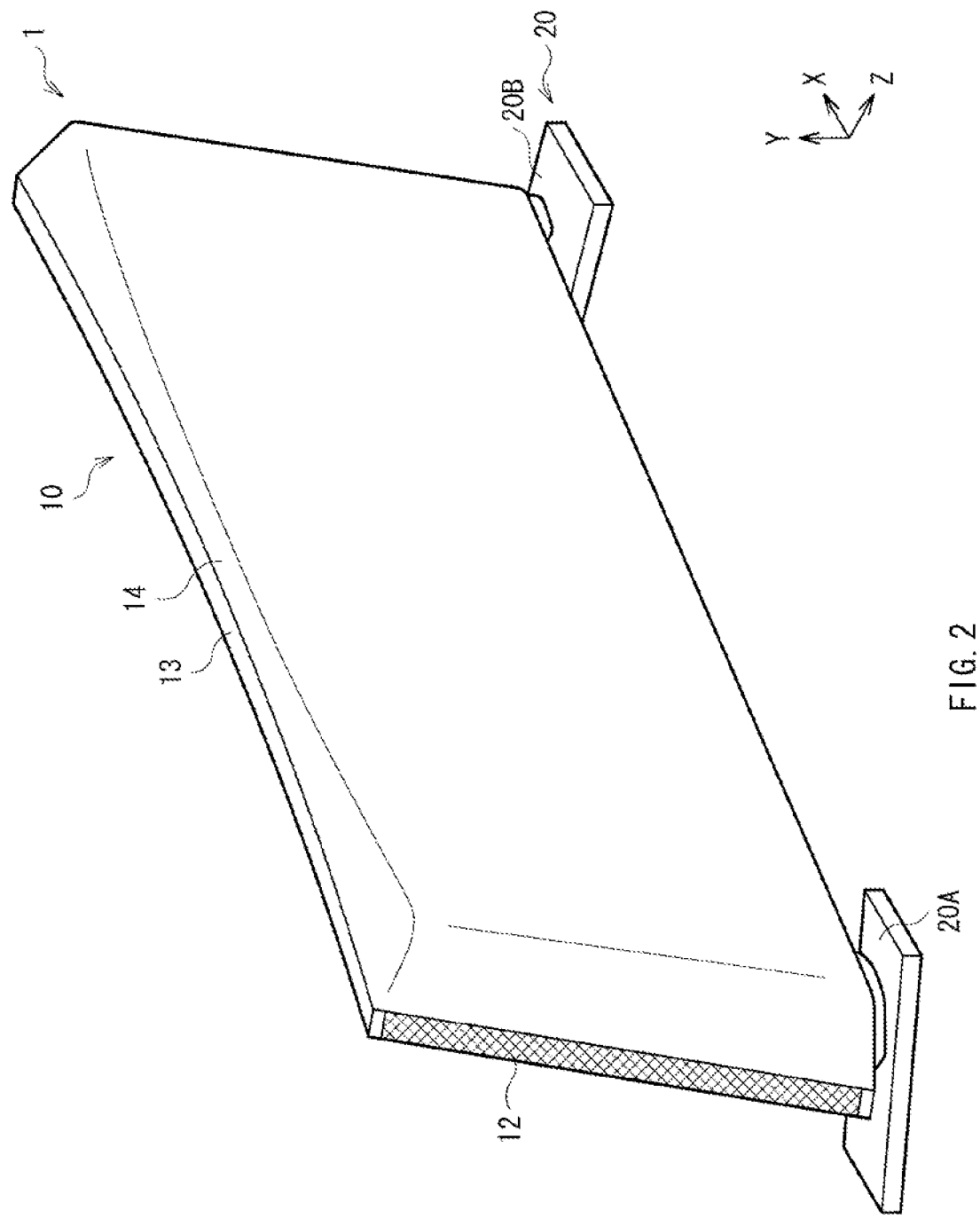
FIG. 2 is a perspective view showing an exemplary external appearance of the display illustrated in FIG. 1 as viewed from a back side.

FIG. 1 shows an external appearance of a display 1 according to an embodiment of the present invention as viewed from a front side, and FIG. 2 shows an external appearance of the display 1 as viewed from a back side. The display 1 may serve as, for example, a television, and has a configuration in which a plate-shaped main body section 10 for image display is supported by stands 20A and 20B (which are collectively referred to as stands 20 in the following description). It should be noted that the display 1 is used as a standing type display that is placed on a horizontal plane such as a floor, a shelf, and a bench in a state where the stands 20 are mounted to the main body section 10, but the display 1 may also be a wall-hanging type display that is used in a state where the stands 20 are dismounted from the main body section 10.

As used herein, a front-rear direction of the main body section 10 is referred to as a Z direction, a left and right direction and an upper and lower direction of the main face (broadest face) of the main body section 10 are referred to as an X direction and a Y direction, respectively.

The main body section 10 may include a liquid crystal panel 11 serving as a display body, for example. Front exterior members 12 that hide speakers described later are installed on the left and right ends of the main body section 10. Dress members (front bezels) 13 cover the upper and lower sides of the liquid crystal panel 11 and front exterior members 12. A rear exterior member (rear cover) 14 covers the back face of the main body section 10.

Figure 3:
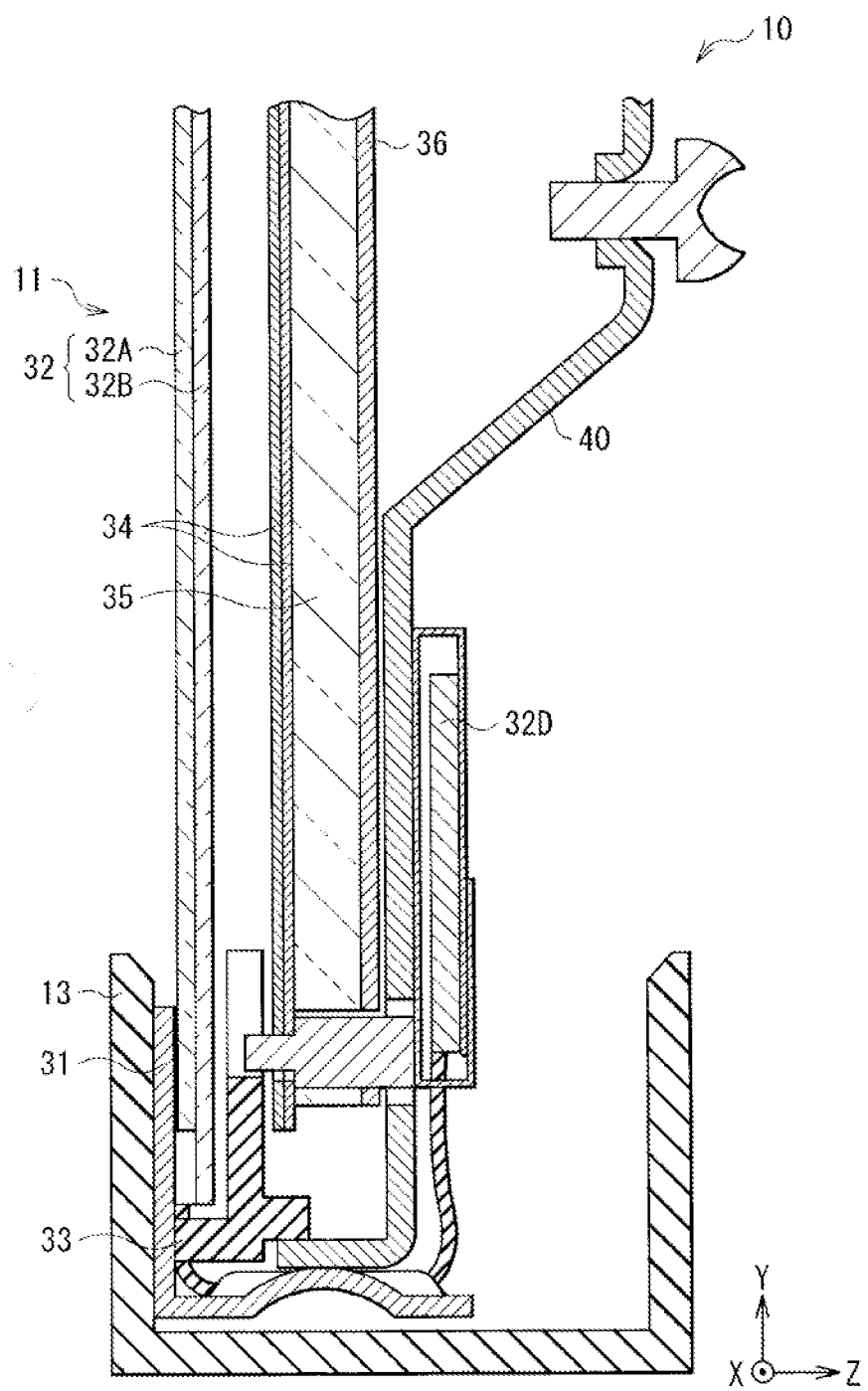
FIG. 3 is a sectional view showing an exemplary internal configuration of a center portion of a liquid crystal panel illustrated in FIG. 1.

FIG. 3 shows an internal configuration of a center portion of the liquid crystal panel 11 illustrated in FIG. 1, and shows a cross section along the Y direction. The liquid crystal panel 11 includes a front housing (top chassis) 31, a liquid crystal cell 32, a middle housing (middle chassis) 33, an optical sheet 34, a light guide plate 35, and a reflection plate 36 in this order from the front to rear in the Z direction. It should be noted that a plate member 40 described later is provided in rear of the reflection plate 36.

The front housing 31 is a frame-shaped metal component that covers the front peripheral portion of the liquid crystal panel 11. The liquid crystal cell 32 may have a configuration in which a liquid crystal layer (not illustrated) is sealed between two substrates 32A and 32B which may be made of glass or the like, for example. The liquid crystal cell 32 may include a source driver and a source substrate 32D, for example. The middle housing 33 is a frame-shaped resin component that holds the liquid crystal cell 32 and the optical sheet 34. The optical sheet 34 may include a diffusion plate, a diffusion sheet, a lens film, and/or a polarization separation sheet, for example. The light guide plate 35 guides light from a light source (not illustrated) to the liquid crystal panel 11 side, and may mainly contain a transparent thermoplastic resin such as a polycarbonate resin (PC) and an acrylic resin (for example, PMMA (polymethyl methacrylate)), for example. The reflection plate 36 reflects light emitted to the rear side of the light guide plate 35 back to the light guide plate 35, and may be a member having a plate shape or a sheet shape and configured of a foamed PET (polyethylene terephthalate), a silver deposition film, a multi-layer reflection film, a white PET, or the like.

The main components of the liquid crystal panel 11 (except for frame shaped components and substrates), namely, the liquid crystal cell 32, the optical sheet 34, the light guide plate 35, and the reflection plate 36, are each configured of a flexible member made of glass or resin having a thin plate shape or a sheet shape. Thus, the liquid crystal panel 11 has flexibility as a whole.

Figure 4:
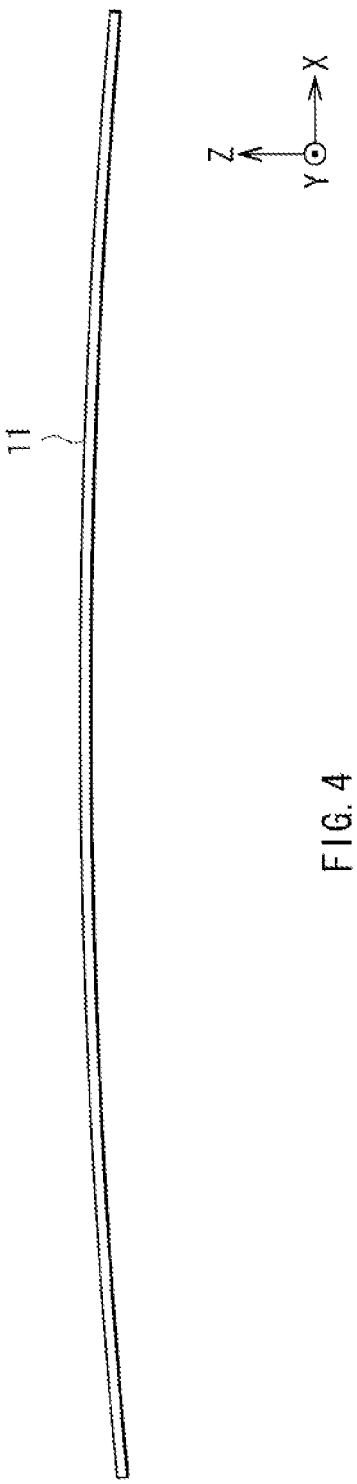
FIG. 4 is a top view showing an exemplary curved shape of the liquid crystal panel illustrated in FIG. 1.

The liquid crystal panel 11 illustrated in FIG. 1 is curved in a circular arc shape in one-dimensional direction (X direction). To be more specific, preferably, the liquid crystal panel 11 may be curved rearwardly (to the back side) in a convex manner as illustrated in FIG. 4 for example. In this manner, when viewed from a front side, the liquid crystal panel 11 appears to be narrowed gradually towards its center portion from its left and right portions (see FIG. 13). Hence, it is possible to achieve a sense of unity and a sense of absorption by the visual effect of perspective.

In addition, preferably, the curved shape of the liquid crystal panel 11 may be uniform in the Y direction. When the curvature varies in the Y direction, the liquid crystal panel 11 may be locally twisted, and consequently the liquid crystal panel 11 may be damaged, or display defect may be caused.

Preferably, the stands 20 illustrated in FIGS. 1 and 2 may be provided at the left and right lower portions of the main body section 10, for example. One reason for this is as follows. When the liquid crystal panel 11 is curved rearwardly in a convex manner, the left and right ends thereof are positioned forward with respect to the center of gravity of the main body section 10, and therefore the stands 20 are hidden by the main body section 10, thereby making it possible to make protrusion of each stand 20 toward the front side of the main body section 10 less noticeable in comparison with the case where the liquid crystal panel 11 is flat. In addition, as described later, since speakers are disposed at the left and right ends of the main body section 10, the speakers are surely supported by the stands 20 laid at the left and right lower portions of the main body section 10.

It should be noted that, other than the left and right lower portions of the main body section 10, the stands 20 may also be provided at a center lower portion of the main body section 10. In addition, in the case where the liquid crystal panel 11 is designed to be greatly curved, the main body section 10 may independently stand without the stands 20. The stands 20A and 20B disposed on the left side and the right side, respectively, in FIG. 2 may be provided in a separated manner, or a coupled manner.

Figure 5:
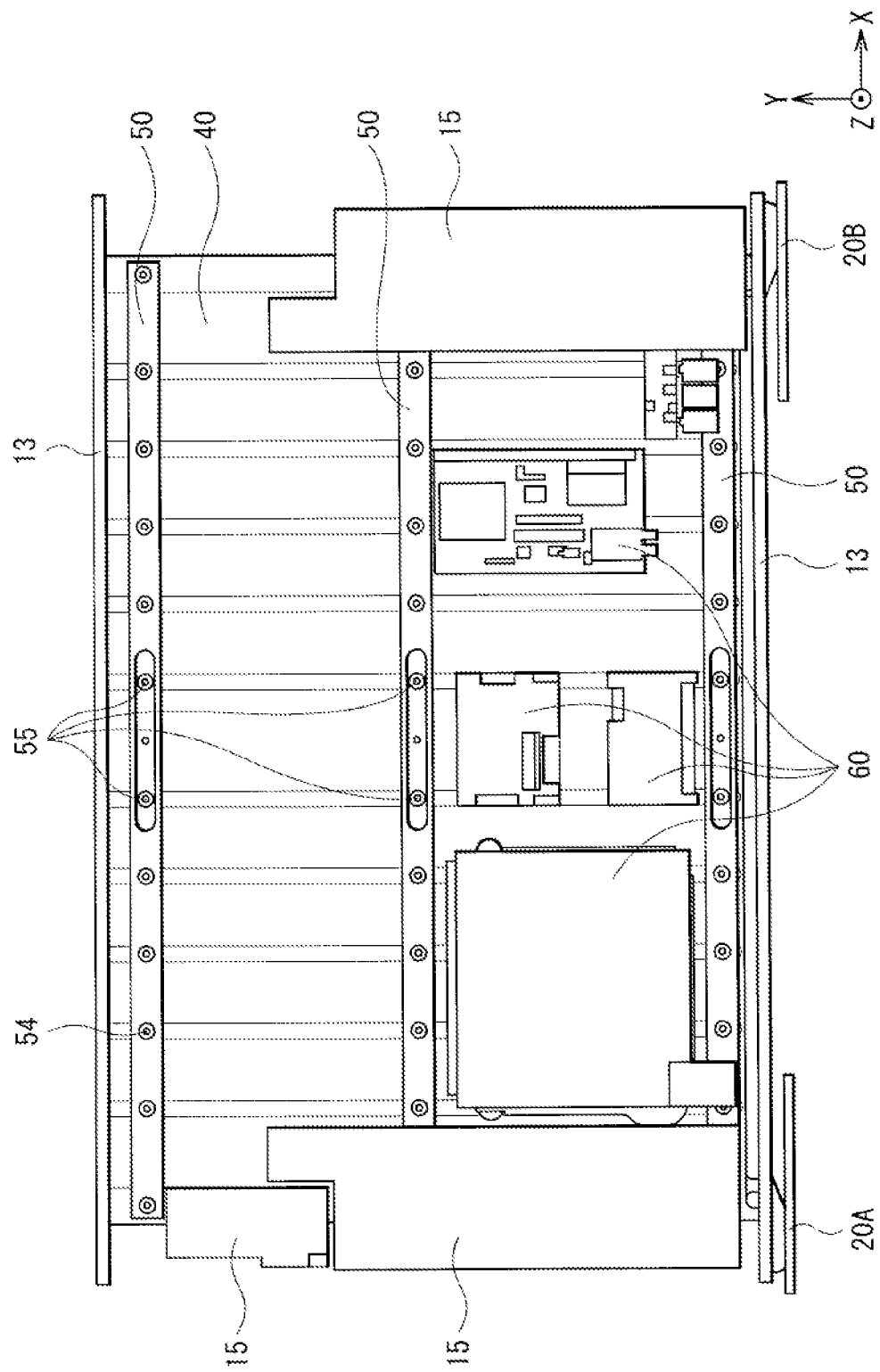
FIG. 5 is a rear view showing an exemplary configuration of the display illustrated in FIG. 1 as viewed from a back side, in a state where a front exterior member and a rear exterior member are dismounted from the display.

FIG. 5 shows a configuration of the display 1 as viewed from a back side in a state where the front exterior member 12 and the rear exterior member 14 are dismounted from the display 1 illustrated in FIG. 1. The plate member 40 and the frame members 50 are disposed inside the rear exterior member 14. The plate member 40 and the frame members 50 are described in detail later.

Speakers 15 are respectively disposed at the left and right ends (left and right sides of the liquid crystal panel 11) of the main body section 10. Disposing the speakers 15 at the left and right ends of the main body section 10 in this manner allows image and sound to be visually integrated without being separated from each other, thus making it possible to further promote a sense of unity and a sense of absorption in conjunction with the above-described visual effect of perspective by the curvature of the liquid crystal panel 11.

Preferably, the speakers 15 may protrude rearwardly of the plate member 40 from the left and right side of the liquid crystal panel 11. This makes it possible to secure the volume of the speakers 15, and to achieve increase in output and enhancement in sound quality. It should be noted that the external face of the rear exterior member 14 may have a curved shape similarly to the liquid crystal panel 11, but preferably the external face may have a flat shape as illustrated in FIG. 2 for example. With this configuration, a broad space is defined between the plate member 40 and the rear exterior member 14, and the speakers 15 may be disposed to extend around to the back of the plate member 40 in the space to allow the volume of the speakers 15 to be increased.

Substrates 60 are mounted on the back face of the plate member 40. The substrates 60 may include a source substrate, a timing controller substrate, and a balancer substrate that controls a backlight light source.

Figure 6:
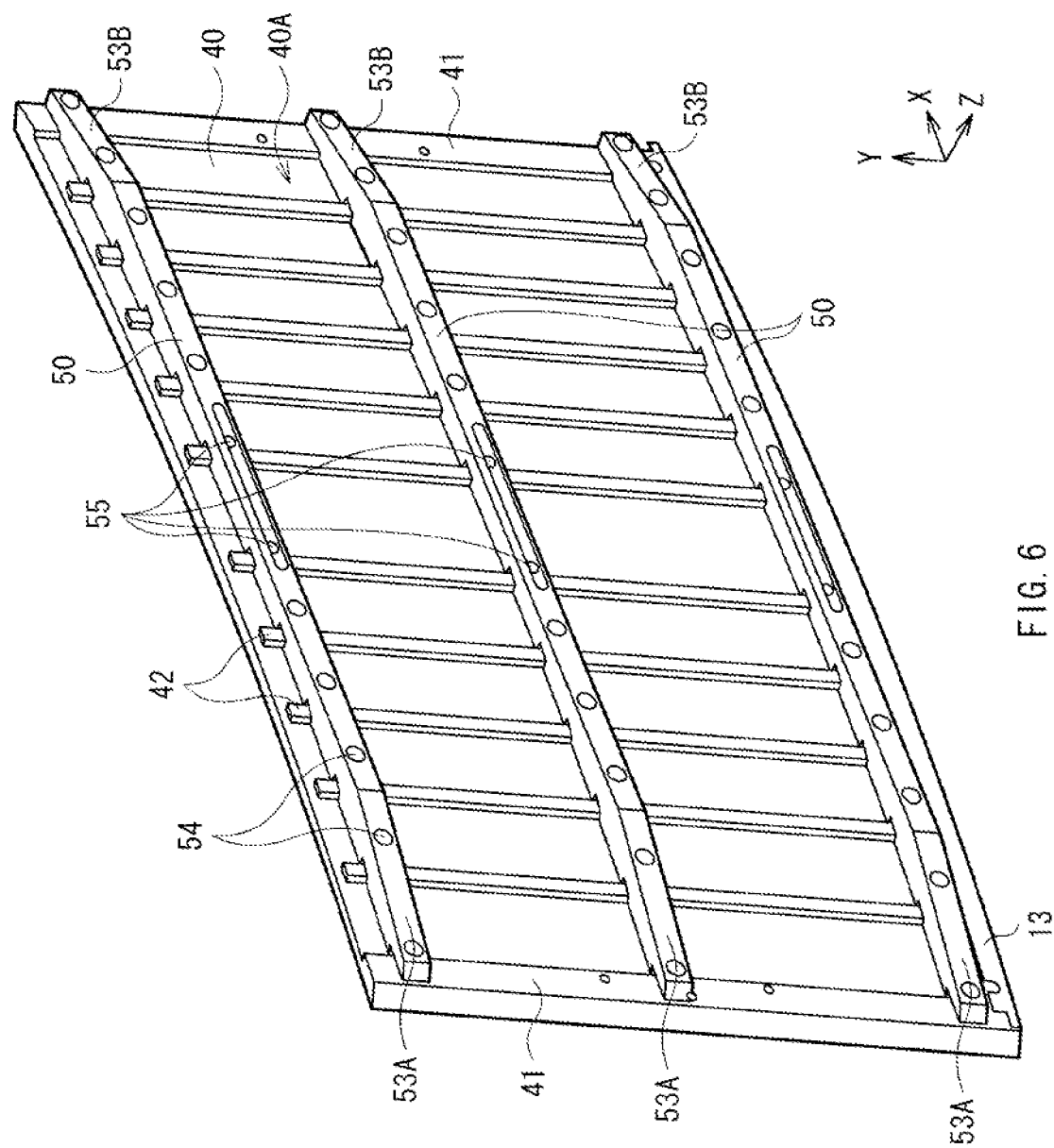
FIG. 6 is a perspective view showing an exemplary configuration of the plate member and the frame member illustrated in FIG. 5 as viewed from a back side.
Figure 7:
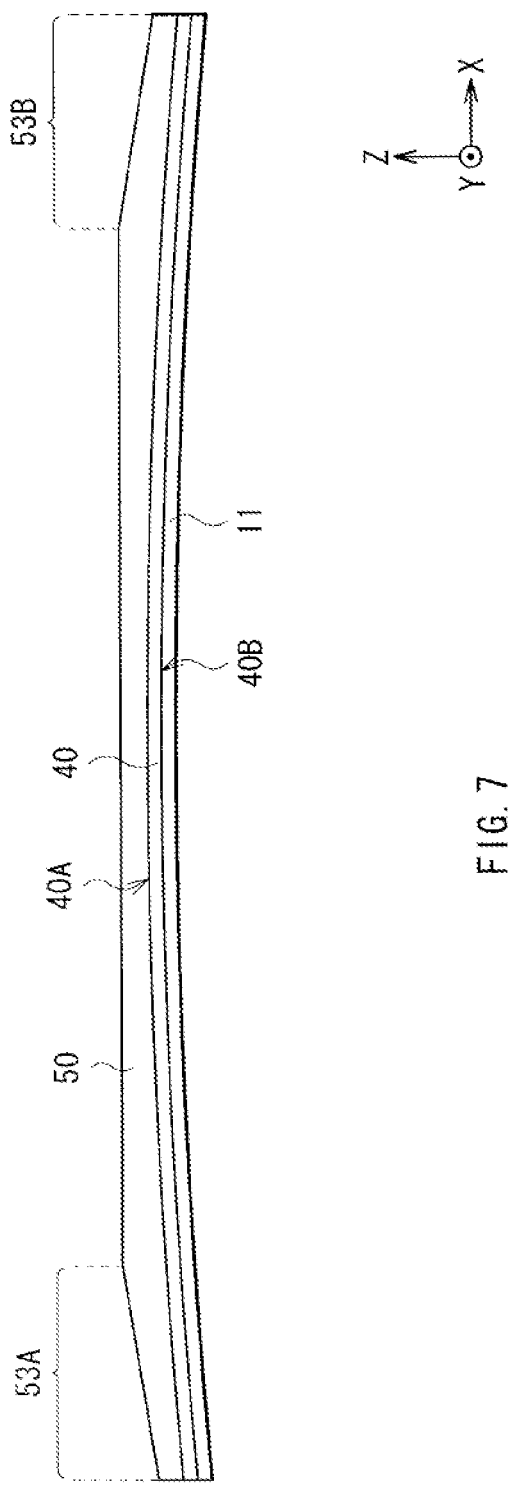
FIG. 7 is a top view showing an exemplary shape of the frame member, the plate member, and the liquid crystal panel.

FIG. 6 shows a configuration of the plate member 40 and the frame members 50 which are illustrated in FIG. 5, as viewed from a back side. FIG. 7 shows a configuration of the frame member 50, the plate member 40, and the liquid crystal panel 11 as viewed from above. The plate member 40 is configured of a flexible plate made of metal or resin, and has a first face (back face) 40A and a second face (front face) 40B facing each other. The frame members 50 are provided on the first face 40A of the plate member 40. The frame members 50 extend in one direction (X direction) on the first face 40A of the plate member 40. The above-described flexible liquid crystal panel 11 is disposed on the second face 40B of the plate member 40. Thus, the liquid crystal panel 11 is allowed to have any desired shape in the display 1.

Figure 8:
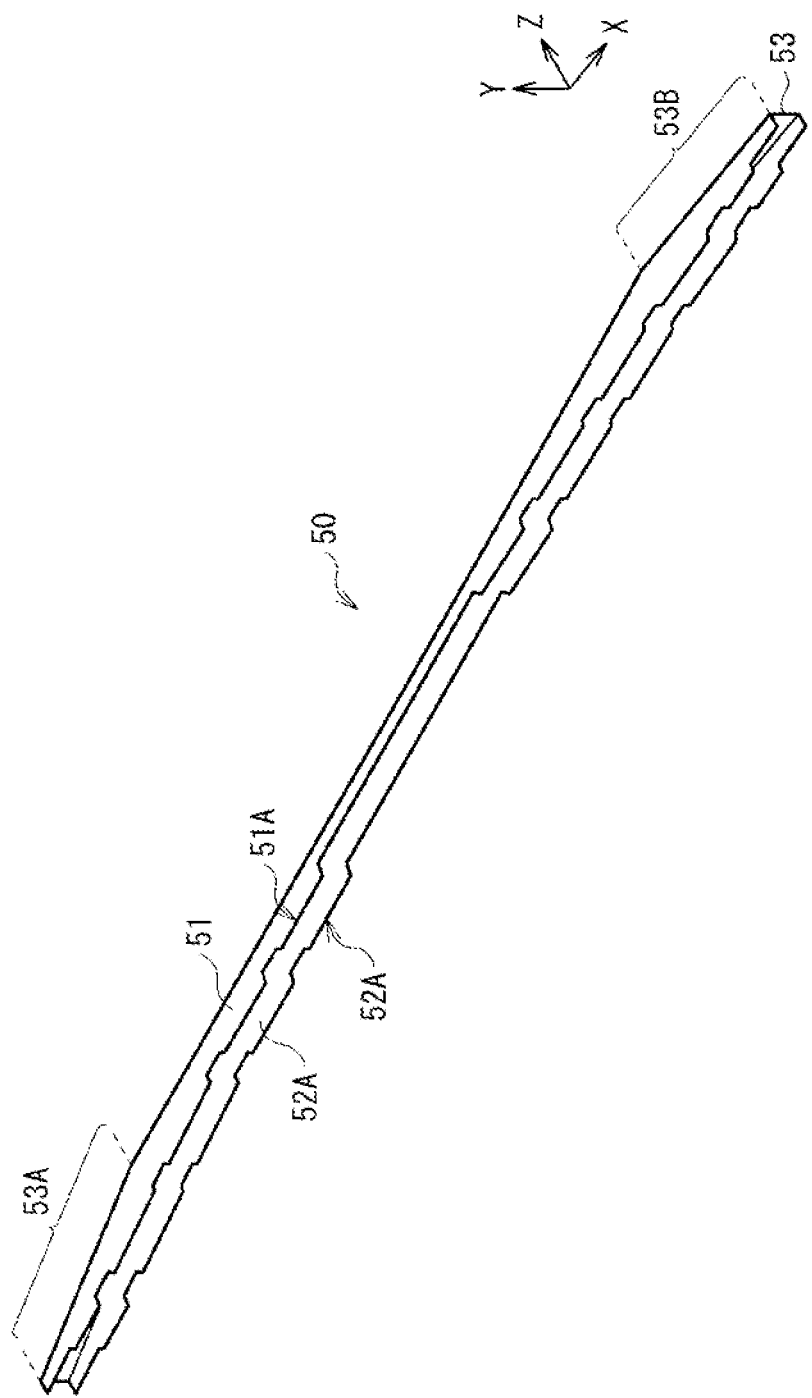
FIG. 8 is a perspective view showing an exemplary configuration of the frame member illustrated in FIG. 6 as viewed from a front side.

FIG. 8 shows a configuration of the frame members 50 illustrated in FIG. 6 as viewed from a front side (a side to be attached to the plate member 40). The frame members 50 may have a rectangular cylinder shape having three faces configured of a top face section 51 and a bottom face section 52 which are parallel to each other, and a side face section 53 which connects the top face section 51 and the bottom face section 52, for example. Sides 51A and 52A of the top face section 51 and the bottom face section 52 face the plate member 40. The side face section 53 is provided with screw holes 54 for fixation to the plate member 40, and if necessary, VESA (video electronics standard association) holes (not illustrated in FIG. 8, see FIG. 5 and FIG. 6) for attachment of wall-hanging brackets (not illustrated).

Figure 9:
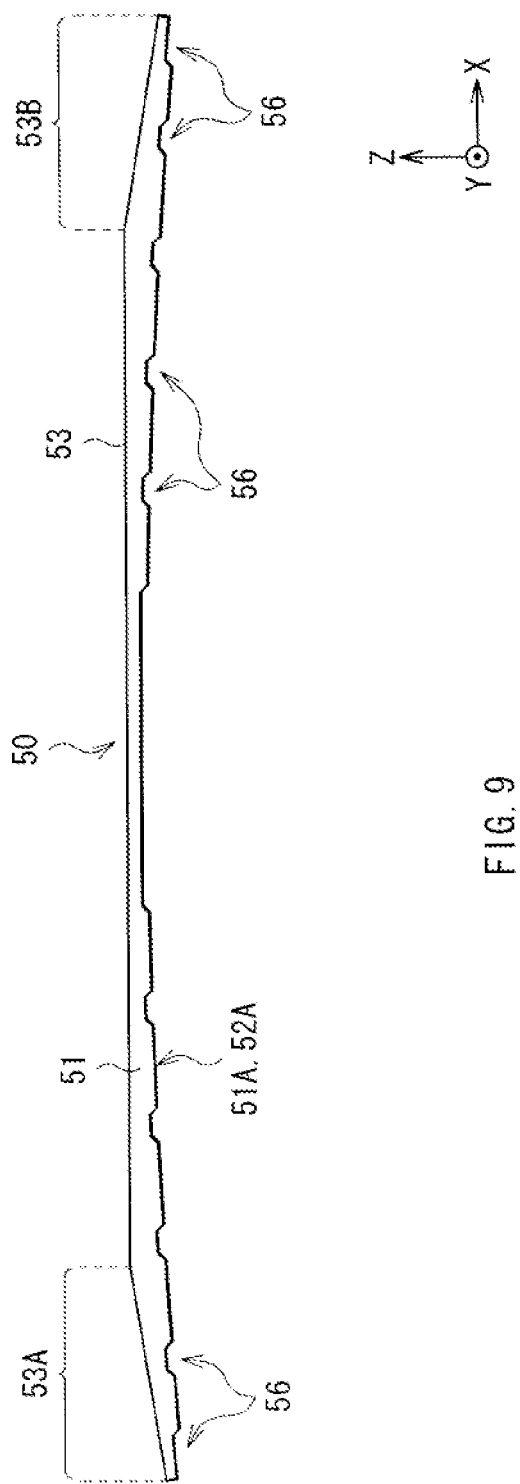
FIG. 9 is a top view showing an example of the frame member illustrated in FIG. 8.

FIG. 9 shows a configuration of the frame members 50 illustrated in FIG. 8 as viewed from above (from the top face section 51 side). Incidentally, a configuration of the frame members 50 as viewed from below (from the bottom face section 52 side) may be the same as the configuration shown in FIG. 9. The sides 51A and 52A of the frame member 50 which face the plate member 40 each has a circular arc shape curved in one-dimensional direction in an extending direction (X direction) of the frame members 50. Specifically, the sides 51A and 52A are curved rearwardly (or, to the side face section 53 side) in a convex manner.

As illustrated in FIG. 7, in the extending direction (X direction) of the frame member 50, the plate member 40 has the shape same as that of the sides 51A and 52A of the frame member 50 which face the plate member 40. In other words, the plate member 40 has, along the sides 51A and 52A, a circular arc shape that is curved in one-dimensional direction in the extending direction (X direction) of the frame members 50. Specifically, the plate member 40 is curved rearwardly (or, to the first face 40A side) in a convex manner. The liquid crystal panel 11 may have the same shape as that of the plate member 40.

As illustrated in FIG. 6, in total, three of the frame members 50 may be provided at a location in the proximity of an upper side of the plate member 40, a location in the proximity of a lower side thereof, and a location intermediate between the upper and lower sides, respectively, and preferably the sides 51A and 52A, which face the plate member 40, of the three frame members 50 may have the same shape. This makes it possible to make the curved shape of the liquid crystal panel 11 uniform in the Y direction. Accordingly, the possibility that the liquid crystal panel 11 is curved in two-dimensional directions, the X and Y directions, is decreased, thus making it possible to suppress the damage and display defect of the liquid crystal panel 11 due to local twisting.

Preferably, left and right sections 53A and 53B of the side face section 53 of the frame members 50 may be curved forwardly (or to the sides 51A and 52A side) as illustrated in FIG. 9. With this configuration, a broad space is defined between the frame members 50 and the rear exterior member 14, and the speakers 15 may be disposed to extend around to the back of the frame members 50 in the space to allow the volume of the speakers 15 to be increased.

Figure 10:
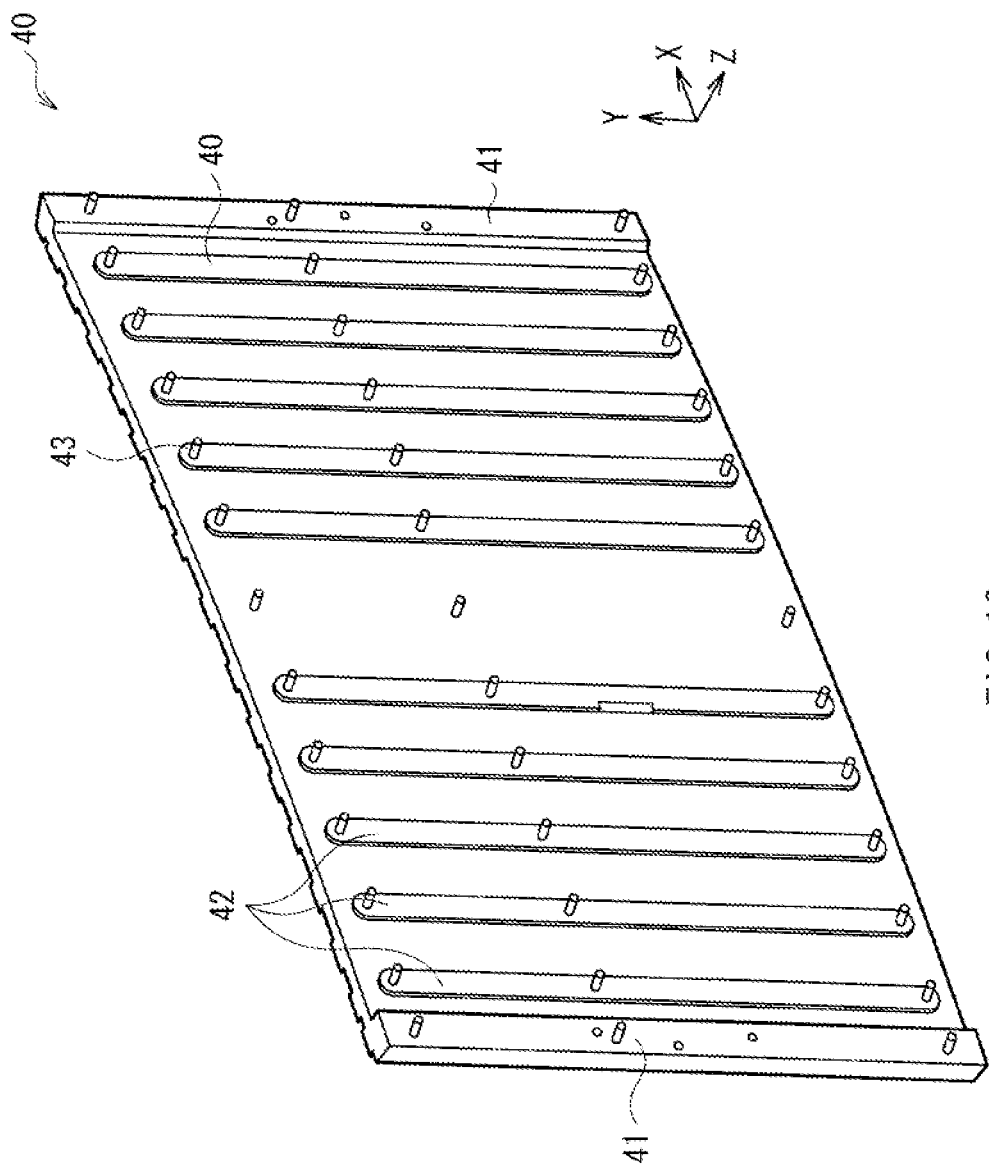
FIG. 10 is a perspective view showing an exemplary configuration of the plate member illustrated in FIG. 6 as viewed from a back side.

FIG. 10 shows a configuration of the plate member 40 illustrated in FIG. 6 as viewed from the first face (back face) 40A side. As described above, the plate member 40 is configured of a flexible metal plate or resin plate. The material and thickness of the plate member 40 are not specifically limited as long as they are adjusted such that the plate member 40 has flexibility. For example, the plate member 40 may be formed to have a thickness of about 0.2 mm to about 3 mm both inclusive, and may be made of iron, aluminum, glass, resin, or the like.

The plate member 40 includes first protrusions 41. The first protrusions 41 may be linear raised portions formed by drawing of the plate member 40 for example, and extend in a direction different from the extending direction of the frame members 50 (X direction), specifically, in a direction (Y direction) orthogonal to the extending direction of the frame members 50. The first protrusions 41 have a function of a reinforcement structure that holds the curved shape of the plate member 40 in the X direction formed by the frame members 50. That is, with the first protrusions 41, the stiffness of the plate member 40 is increased in the extending direction (Y direction) of the first protrusions 41, and therefore the possibility of losing the curved shape of the plate member 40 in the X direction is decreased.

Preferably, the first protrusions 41 may be provided at both end portions of the extending direction (X direction) of the frame members 50. Specifically, since the frame members 50 may be provided entirely from the left side to the right side of the plate member 40 in the X direction, the first protrusions 41 may be preferably provided along the left side and the right side of the plate member 40. This makes it possible to increase the stiffness of the both end portions of the plate member 40 in the extending direction (X direction) of the frame members 50, and to obtain improved reinforcement effect. It should be noted that the first protrusions 41 may not necessarily be provided at both ends (left and right sides) of the plate member 40, and may be provided at positions near the center rather than the left and right sides of the plate member 40. In addition, the locations where the first protrusions 41 are provided are not limited to two locations, the left and right sides, of the plate member 40, and it suffices to provide the first protrusion 41 at least at one location in the extending direction (X direction) of the frame members 50.

Figure 11:
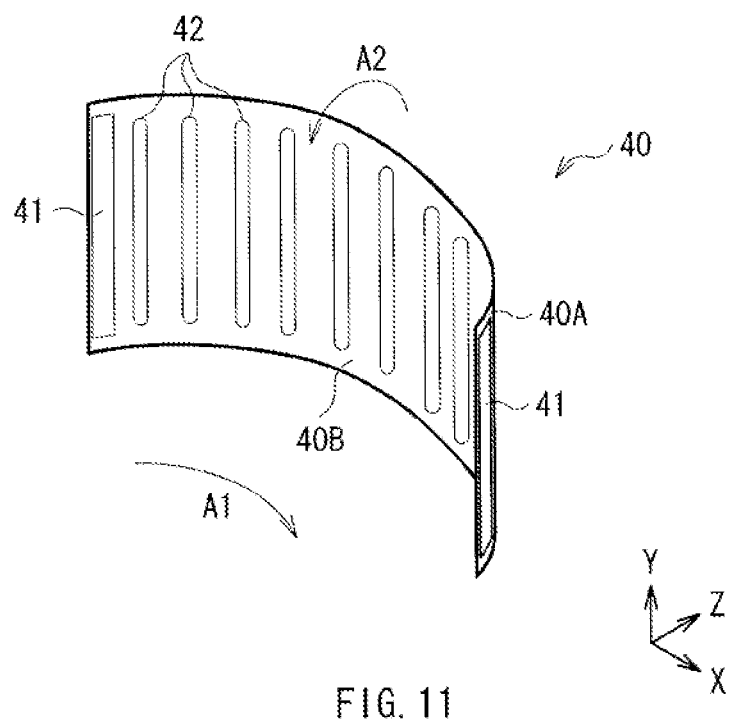
FIG. 11 is a perspective view for describing a function of a second protrusion illustrated in FIG. 10.

In addition, the plate member 40 includes a plurality of second protrusions 42 provided in parallel to each other. The second protrusions 42 may be linear raised portions formed by drawing of the plate member 40 for example, and extend in a direction different from the extending direction (X direction) of the frame members 50, specifically, in a direction (Y direction) orthogonal to the extending direction of the frame members 50. The second protrusions 42 are arrayed in the extending direction (X direction) of the frame members 50. With the second protrusions 42, it is possible to readily bend the plate member 40 along the array direction (X direction) of the second protrusions 42, or along an arrow A1 direction in FIG. 11 for example, but it is difficult to bend the plate member 40 along the other directions such as an arrow A2 direction in FIG. 11, and therefore it is possible to hold the curved shape of the plate member 40 favorably. Therefore, adopting the first protrusions 41 and the second protrusions 42 in combination makes it possible to further enhance the function of the first protrusions 41 as a reinforcement structure.

The plate member 40 is provided with bosses 43 that fix the frame members 50. The bosses 43 may be attached to the second protrusions 42 for example. Naturally, the screw holes 54 of the side face section 53 of the frame members 50 are provided at positions corresponding to the positions of the bosses 43 on the frame members 50. It is to be noted that the positions of the bosses 43 and the screw holes 54 are not specifically limited, and the bosses 43 and the screw holes 54 may be provided positions other than on the second protrusions 42. The number of the bosses 43 and the screw holes 54 is also not specifically limited, but a smooth curved shape may be formed when the number is increased. It should be noted that, desirably, the height of the bosses 43 may be adjusted according to the dimension and the shape of the frame members (such as the width of the top face section 51 and the bottom face section 52, bending of the left and right sections 53A and 53B of the side face section 53), and the like.

It should be noted that, desirably, in order to avoid interference between the first protrusions 41 and the second protrusions 42, clearance grooves 56 may be provided to the top face section 51 and the bottom face section 52 of the frame members 50 illustrated in FIG. 8 and FIG. 9.

Figure 12:
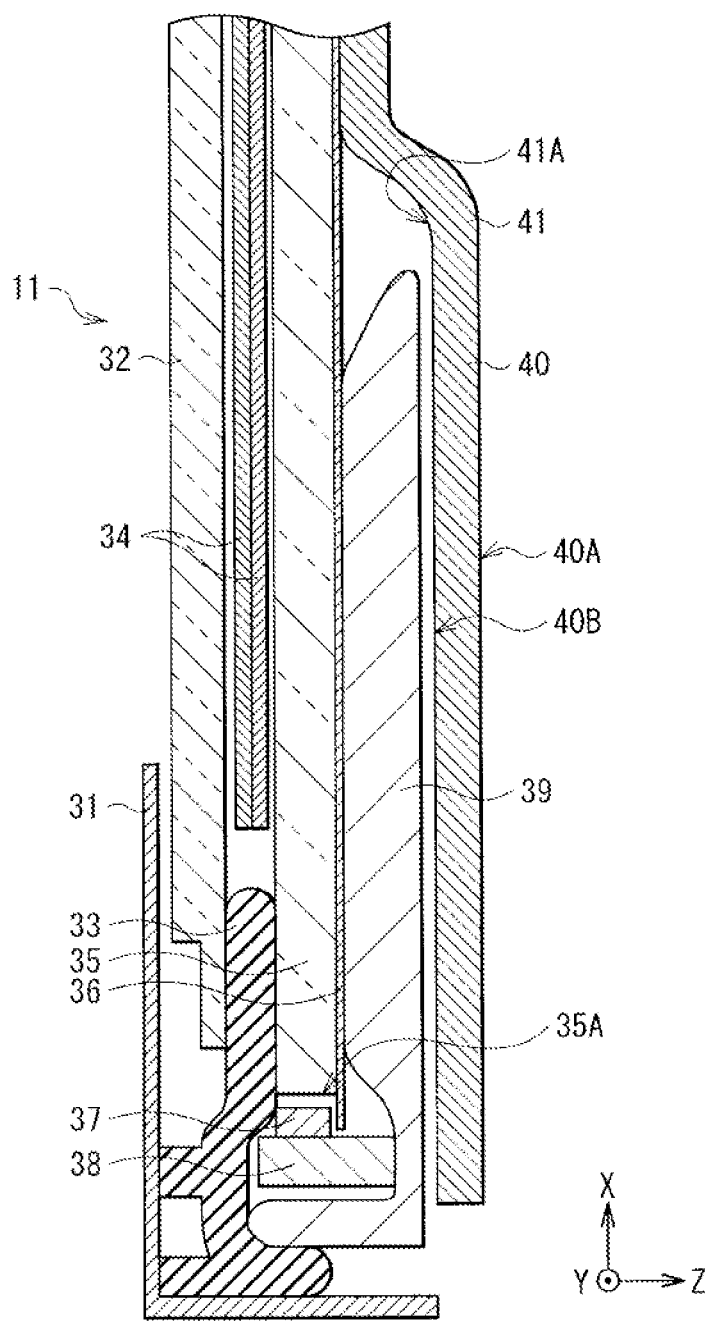
FIG. 12 is a sectional view showing an exemplary internal configuration of the liquid crystal panel in the proximity of a first protrusion illustrated in FIG. 10.

FIG. 12 shows an internal configuration of the liquid crystal panel 11 near the first protrusions 41 illustrated in FIG. 10, and shows a cross section along the X direction. A light source 37 that illuminates the liquid crystal panel 11 may be provided on each of the left and right side faces of the light guide plate 35. The light source 37 may be configured of an LED (light emitting diode) or a semiconductor laser, may be sealed in a package (not illustrated), may be mounted to a light source substrate 38, and may be disposed in facing relation to a light incident face 35A of the light guide plate 35. The light source substrate 38 is provided on a heat releasing plate 39. The heat releasing plate 39 dissipates heat generated at the light source 37, and is configured of a metal plate which may be made of aluminum (Al) or the like.

The heat releasing plate 39 is provided in such a manner as to extend in a direction different from the extending direction (X direction) of the frame members 50, specifically, in a direction (Y direction) orthogonal to the extending direction of the frame members 50. In addition, the heat releasing plate 39 is a metal plate which may have a thickness of about 2 mm, and has high strength. Accordingly, in addition to the above-described heat releasing function, the heat releasing plate 39 is allowed to have a function as a reinforcement structure similarly to the first protrusions 41. That is, with the heat releasing plate 39, it is possible to reinforce the stiffness of the plate member 40 in the extending direction (Y direction) of the heat releasing plate 39, thus decreasing the possibility of losing the curved shape of the plate member 40 in the X direction.

Preferably, the above-described heat releasing plate 39 serving also as a reinforcement structure may be provided at the both end portions in the extending direction (X direction) of the frame members 50. Specifically, since the frame members 50 may be provided entirely from the left side to the right side of the plate member 40 in the X direction, the heat releasing plate 39 may be preferably provided along the left and right sides of the plate member 40. This makes it possible to increase the stiffness of the both end portions of the plate member 40 in the extending direction (X direction) the frame members 50, and to obtain improved reinforcement effect.

In particular, when the heat releasing plate 39 is disposed in a recessed portion 41A located on the rear side of the first protrusions 41, it is possible to increase the above-described reinforcement function by the synergistic effect of the heat releasing plate 39 and the first protrusions 41.

It should be noted that the heat releasing plate 39 may not necessarily be provided at the both ends (left and right side) of the plate member 40, and may be provided at positions near the center rather than the left and right sides of the plate member 40. In addition, the locations where the heat releasing plate 39 is provided are not limited to two locations, the left and right sides, of the plate member 40, and it suffices to provide the heat releasing plate 39 at least at one location in the extending direction (X direction) of the frame members 50.

The display 1 may be manufactured in the following manner.

First, the frame members 50 are screw fixed on the first face 40A of the plate member 40. Here, since the plate member 40 has flexibility, the shape of the plate member 40 is determined by the shape of the sides 51A and 52A of the frame member 50 which face the plate member 40. That is, since the sides 51A and 52A each has a circular arc shape curved in the extending direction (X direction) of the frame members 50, the shape of the plate member 40 accordingly has a shape curved in a circular arc shape.

Accordingly, for example, various kinds of the frame members 50 may be prepared so as to make the curved shapes of the sides 51A and 52A, which face the plate member 40, of the frame members 50 different from one another. With this configuration, by only replacing the frame members 50 according to an intended curved shape of the liquid crystal panel 11, it is possible to readily manufacture the liquid crystal panel 11 having a desired curved shape.

Next, on the second face 40B of the plate member 40, the heat releasing plate 39, the light source substrate 38, and the light source 37 are disposed in the recessed portion 41A located on the rear side of the first protrusions 41. In addition, the reflection plate 36, the light guide plate 35, and the optical sheet 34 are mounted on the second face 40B of the plate member 40. Then, the middle housing 33 is mounted on the peripheral portion of the second face 40B of the plate member 40, the liquid crystal cell 32 is fitted in the middle housing 33, and the front housing 31 is attached to the front peripheral portion of the liquid crystal cell 32. In this manner, the liquid crystal panel 11 is formed on the second face 40B of the plate member 40.

In this case, the main components of the liquid crystal panel 11 (except for the frame shaped components and the substrates), namely, the liquid crystal cell 32, the optical sheet 34, the light guide plate 35, and the reflection plate 36, are each configured of a flexible member made of glass or resin having a thin plate shape or a sheet shape, and thus the liquid crystal panel 11 has flexibility as a whole. Accordingly, the liquid crystal panel 11 has a shape curved in a circular arc shape as following the plate member 40.

After the liquid crystal panel 11 is formed, the speakers 15 are attached to the front housing 31, and the substrates 60 are mounted on the first face 40A of the plate member 40. Thereafter, the speakers 15 are hidden by the front exterior member 12, and the upper and lower sides of the liquid crystal panel 11 and the front exterior member 12 are covered by the dress members 13. In this manner, the main body section 10 is formed. Thereafter, the back face of the main body section 10 is covered by the rear exterior member 14, and the stands 20 are attached to the left and right lower portions of the main body section 10. Thus, the display 1 illustrated in FIG. 1 is completed.

Figure 13:
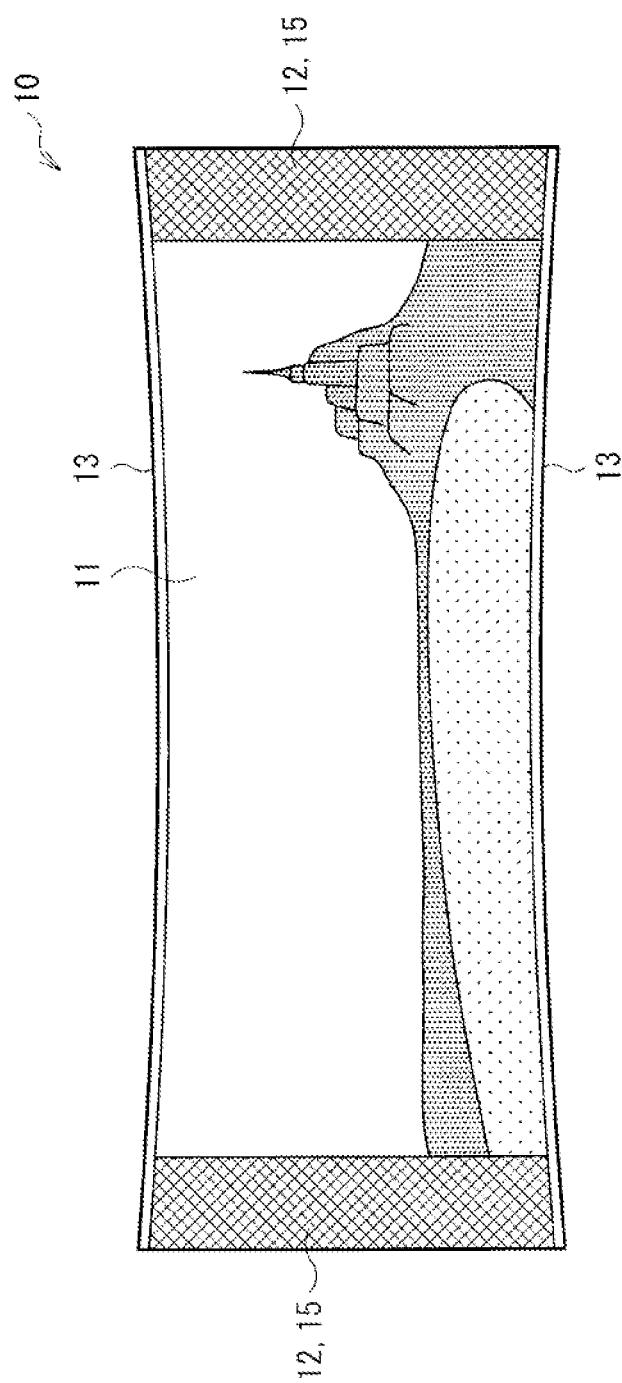
FIG. 13 is a front view schematically showing an exemplary display state of the display illustrated in FIG. 1.

In the display 1, light from the light source 37 is selectively transmitted through the liquid crystal panel 11, and thus image display is performed. In this instance, since the liquid crystal panel 11 is curved rearwardly (to the back side) in a convex circular arc shape in one-dimensional direction (X direction), the liquid crystal panel 11 appears to be narrowed gradually towards its center portion from its left and right portions as illustrated in FIG. 13. Therefore, it is possible to achieve a sense of unity and a sense of absorption by the visual effect of perspective.

In addition, since the speakers 15 are disposed at the left and right portions of the liquid crystal panel 11, image and sound are visually integrated without being separated from each other. As a result, it is possible to further promote a sense of unity and a sense of absorption, in conjunction with the above-described visual effect of perspective by the curvature of the liquid crystal panel 11.

As described above, in the present embodiment, the frame members 50 extending in one direction (X direction) are provided on the first face 40A of the flexible plate member 40, and the flexible liquid crystal panel 11 are disposed on the second face 40B side of the plate member 40. Therefore, it is possible to allow the plate member 40 and the liquid crystal panel 11 to have any desired shape by adjusting the shape of the sides 51A and 52A of the frame member 50 which face the plate member 40.

(Modification 1)

Next, a configuration is described in which the shapes of the plate member 40 and the liquid crystal panel 11 are variable. For example, various kinds of the frame members 50 may be prepared so as to make the curved shapes of the sides 51A and 52A, which face the plate member 40, of the frame members 50 different from one another. With this configuration, by only replacing the frame members 50 according to an intended curved shape of the liquid crystal panel 11, it is possible to readily change the shape of the liquid crystal panel 11.

Further, it is also possible to provide a variable mechanism to the frame members 50 so that the frame members 50 are deformed manually by screwing or the like, or automatically by a motor or the like to change the shapes of the plate member 40 and the liquid crystal panel 11 in accordance with the deformation of the frame members 50. This allows a user to readily change the shape of the liquid crystal panel 11, and to selectively use the shapes of the screen according to images to be viewed and viewing environment.

Modifications of the shapes of the frame members 50, the plate member 40, and the liquid crystal panel 11 encompass those described below.

For example, in the above-mentioned embodiment, a case is described in which the frame members 50, the plate member 40, and the liquid crystal panel 11 are curved entirely in the X direction as illustrated in FIG. 7. However, the frame members 50, the plate member 40, and the liquid crystal panel 11 may be partially curved in the X direction (such that a center portion 71 is flat, but left and right sections 72 and 73 are curved, for example), as illustrated in FIG. 14.

In addition, in the above-mentioned embodiment, a case is described in which the frame members 50, the plate member 40, and the liquid crystal panel 11 are uniformly curved (at a fixed curvature). However, the frame members 50, the plate member 40, and the liquid crystal panel 11 may have curvatures locally different from each other in the X direction. In other words, the frame members 50, the plate member 40, and the liquid crystal panel 11 may be curved such that, with curvature changing points 74 as borders, the center portion 71 is slightly curved, and the left and right sections 72 and 73 are greatly curved as illustrated in FIG. 15.

Figure 14:
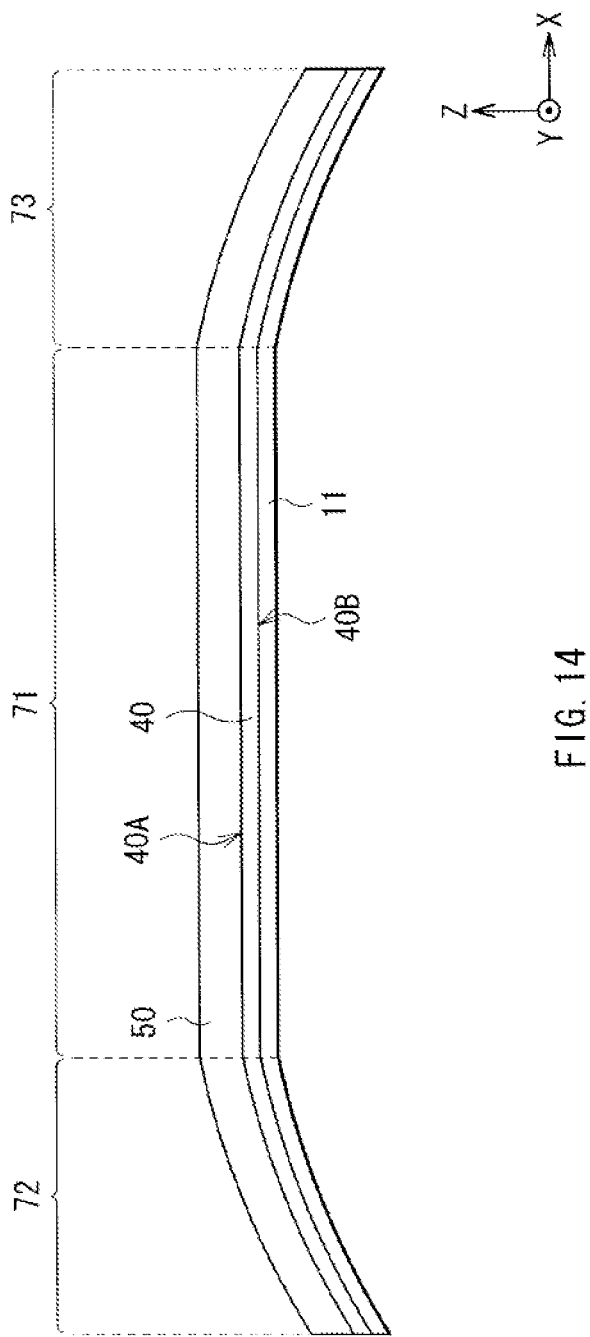
FIG. 14 is a top view showing an exemplary shape of a frame member, a plate member, and a liquid crystal panel according to a modification 1.
Figure 15:
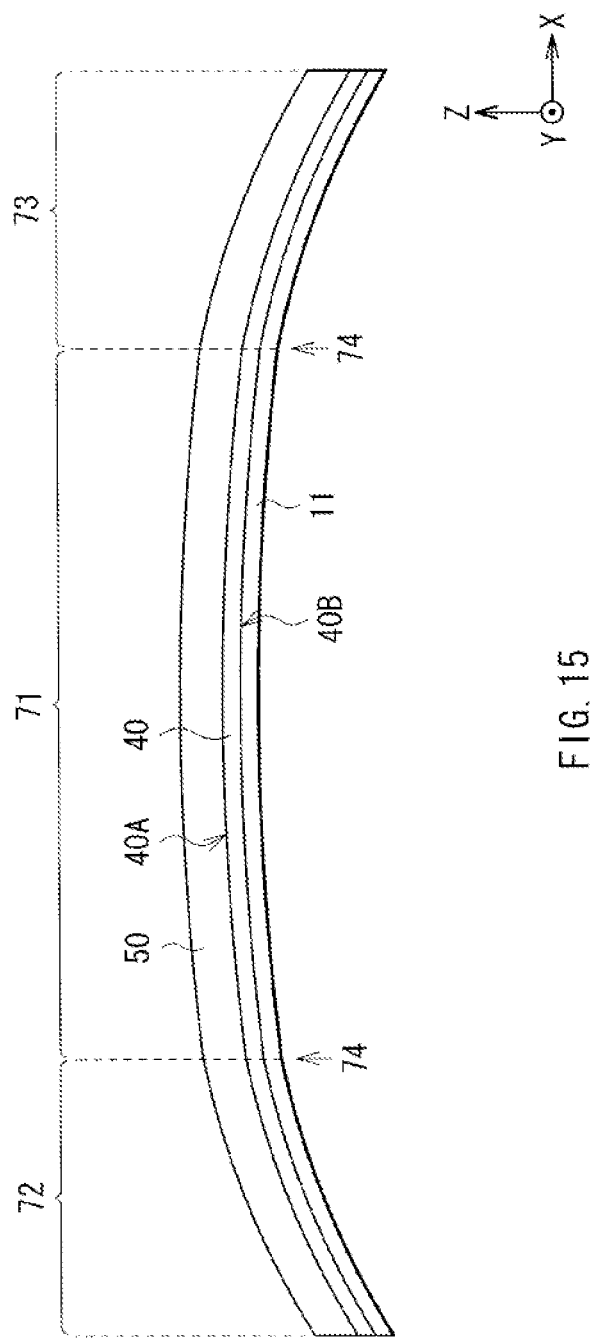
FIG. 15 is a top view showing another exemplary shape of the frame member, the plate member, and the liquid crystal panel.

In the examples illustrated in FIG. 14 and FIG. 15, for example, the flat or slightly curved center portion 71 may be used when an image having an aspect ratio of 4:3 is to be displayed. On the other hand, when an image having an aspect ratio of 16:9 is to be displayed, it is possible to cause a sense of depth with use of the whole display screen including the greatly curved left and right sections 72 and 73.

Figure 16:
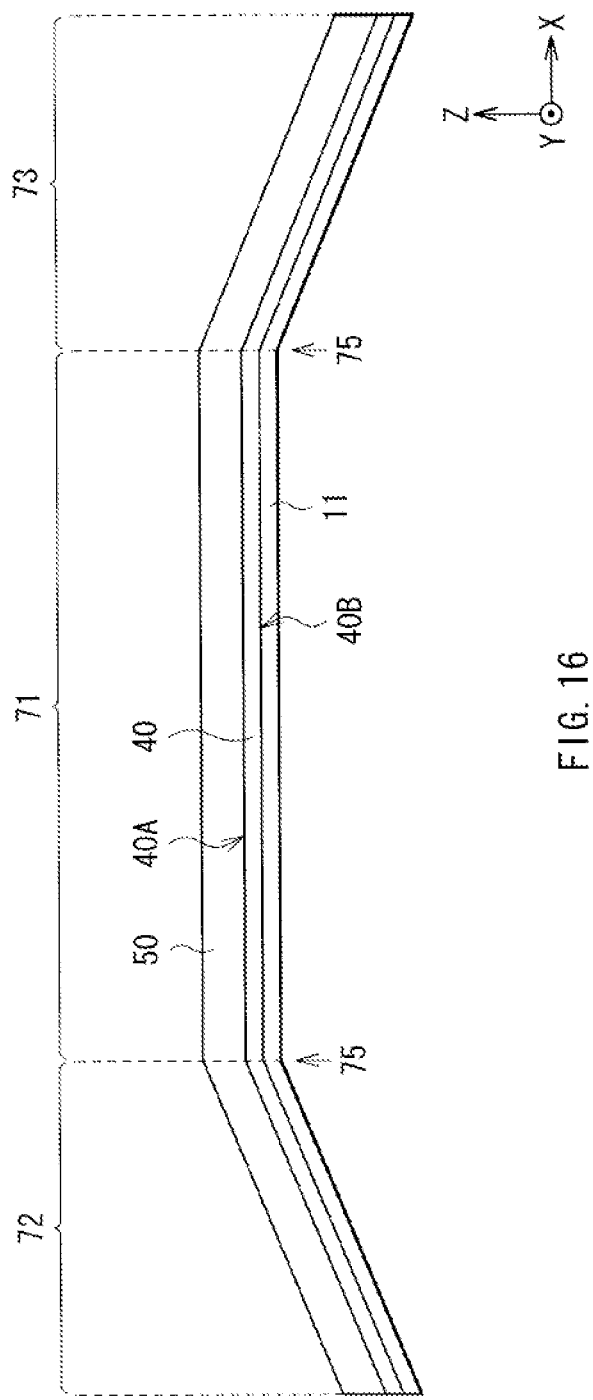
FIG. 16 is a top view showing still another exemplary shape of the frame member, the plate member, and the liquid crystal panel.

Further, in the above-mentioned embodiment, a case is described in which the frame members 50, the plate member 40, and the liquid crystal panel 11 have the curved shape. However, the frame members 50, the plate member 40, and the liquid crystal panel 11 may have a shape of a part of a polygon (a shape having a plurality of flat faces connected to each other) in the X direction. For example, the frame members 50, the plate member 40, and the liquid crystal panel 11 may be configured such that they are sectioned into the center portion 71 and the left and right sections 72 and 73 at bending points 75 as borders, and that the center portion 71 faces the Z direction while the left and right sections 72 and 73 are being inclined with respect to the center portion 71, as illustrated in FIG. 16.

Figure 17:
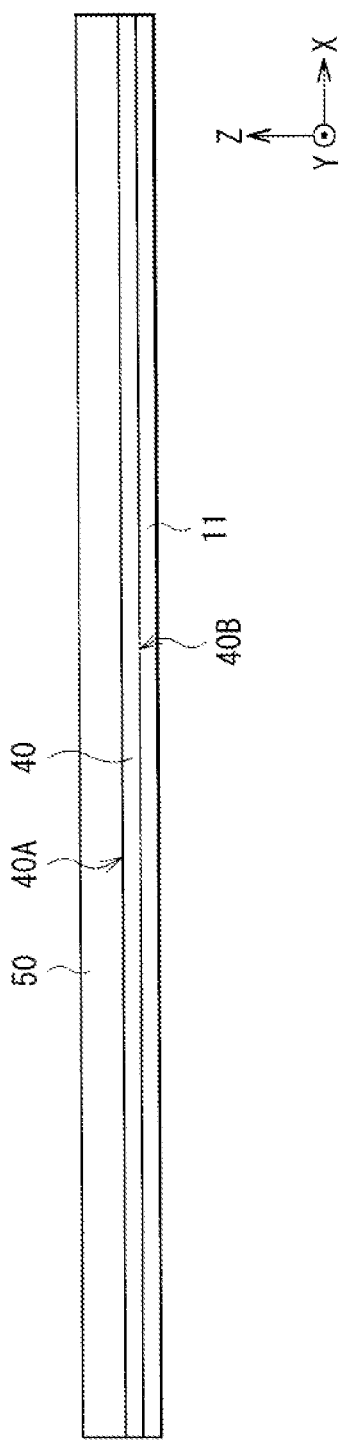
FIG. 17 is a top view showing still another exemplary shape of the frame member, the plate member, and the liquid crystal panel.

Alternatively, the frame members 50, the plate member 40, and the liquid crystal panel 11 may form a flat surface in the X direction as illustrated in FIG. 17.

Figure 18:
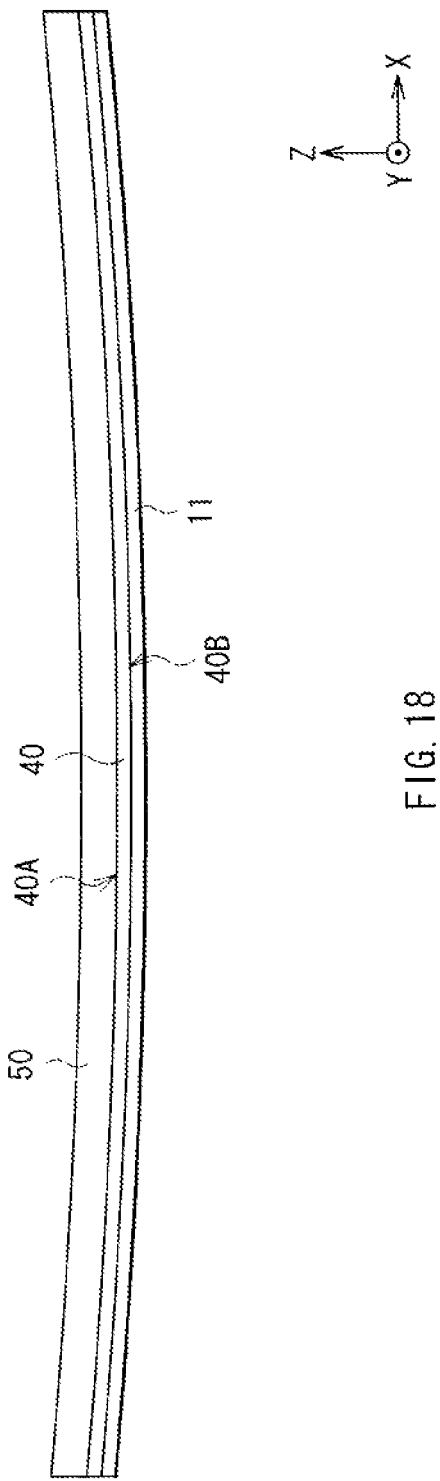
FIG. 18 is a top view showing still another exemplary shape of the frame member, the plate member, and the liquid crystal panel.

Additionally, in the above-mentioned embodiment, a case is described in which the frame members 50, the plate member 40, and the liquid crystal panel 11 are curved rearwardly (to the back side) in a convex manner as illustrated in FIG. 7. However, the frame members 50, the plate member 40, and the liquid crystal panel 11 may be curved forwardly (to the front side) in a convex manner as illustrated in FIG. 18.

It should be noted that the modifications of the shapes of the frame members 50, the plate member 40, and the liquid crystal panel 11 are naturally not limited to those illustrated in FIG. 14 to FIG. 18. In addition, it is also possible to adopt shapes obtained by appropriately combining the above-mentioned embodiment and the above-mentioned modifications.

(Modification 2)

Figure 19:
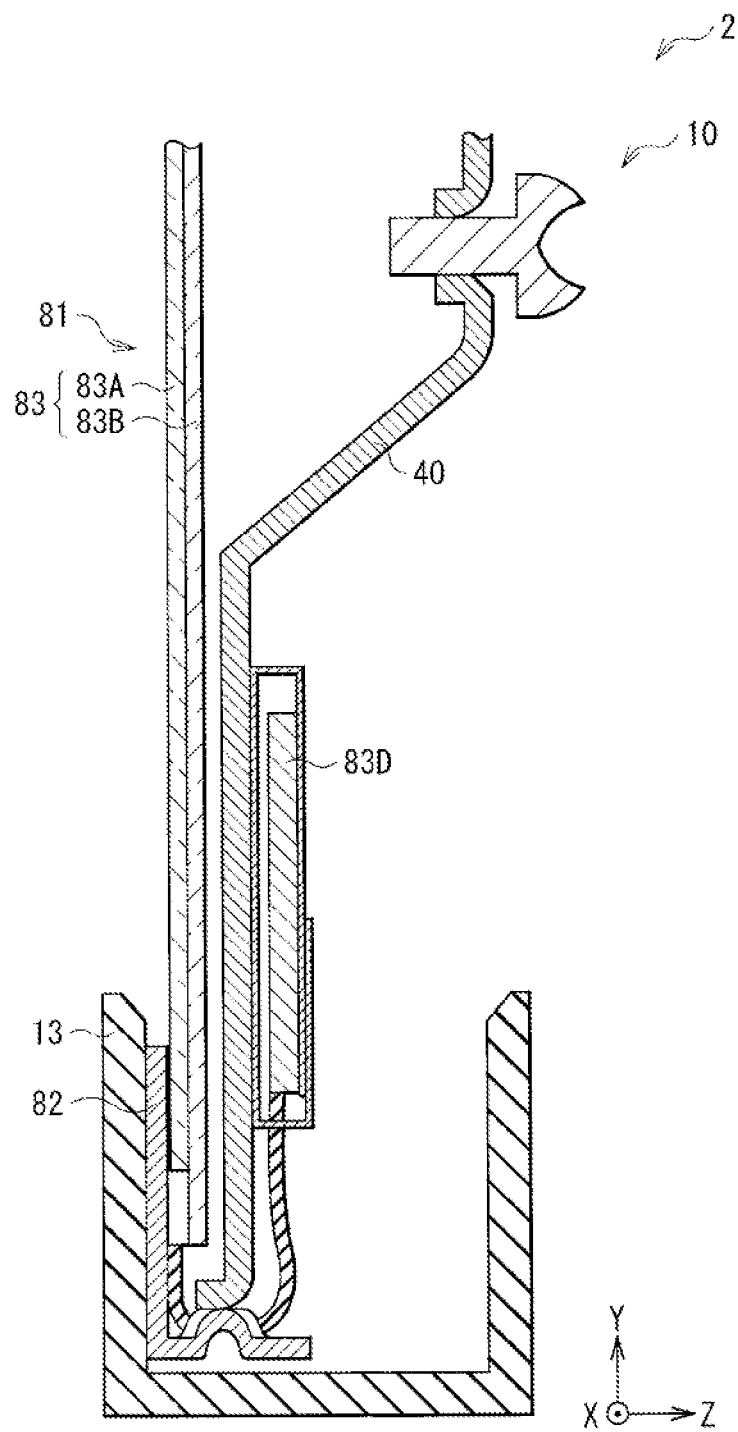
FIG. 19 is a sectional view showing an exemplary internal configuration of a center portion of an organic EL panel in a display according to modification 2.

FIG. 19 shows an internal configuration of the center portion of the main body section 10 of a display 2 according to a modification 2, and shows a cross section along the Y direction. The display 2 according to the present modification has a configuration similar to that of the display 1 according to the above-mentioned embodiment except that the main body section 10 includes an organic EL (electroluminescence) panel 81 as a display body in place of the liquid crystal panel 11. Therefore, the same reference numerals are used for corresponding components.

The organic EL panel 81 includes a front housing (top chassis) 82 and an organic EL cell 83 in this order from front to rear in the Z direction.

The front housing 82 is a frame shaped metal component that covers a front peripheral portion of the organic EL panel 81. The organic EL cell 83 may have a configuration in which an organic EL element (not illustrated) is provided on a substrate 83A which may be made of glass or the like, and sealed by a substrate 83B which may be made of glass or the like, for example. The organic EL cell 83 may include a source driver and a source substrate 83D, for example.

The main component of the organic EL panel 81 (excluding the frame shape component and the substrates) may be only the organic EL cell 83. The organic EL cell 83 is configured of a flexible member made of glass or resin having a thin plate shape or a sheet shape. Accordingly, the flexibility of the organic EL cell 83 is further improved in the modification 2 as compared to the above-mentioned embodiment adopting the liquid crystal panel 11, and hence it is possible to further enhance the effect of the above-mentioned embodiment.

The front exterior member 12, the dress members 13, the rear exterior member 14, the speakers 15 of the main body section 10 are configured similarly to those in the first embodiment. The stand 20, the plate member 40, the frame members 50, and the substrates 60 are configured similarly to those in the first embodiment.

Except that the organic EL panel 81 is provided in place of the liquid crystal panel 11, the display 2 is manufactured similarly to the above-mentioned embodiment. In addition, the function of the display 2 is similar to that of the above-mentioned embodiment.

Hereinabove, while the present disclosure has been described with reference to the example embodiment and the modifications, the present disclosure is not limited to the above-mentioned embodiment and the modifications, and various modifications may be made.

For example, the configurations of the plate member 40 and the frame members 50 are not limited to the exemplary configurations illustrated in FIG. 8 to FIG. 10, and other configurations may also be adopted. For example, the frame members 50 may also be configured of a single belt-shaped plate. In that case, the shape of the plate member 40 is determined by the shape of the face of the frame members 50 facing the plate member 40, and thus the liquid crystal panel 11 has a shape following the plate member 40. In addition, the number and layout of the frame members 50 are not limited to the example illustrated in FIG. 6.

In addition, in the above-mentioned embodiment, a case is described in which the plate member 40 and the liquid crystal panel 11 have the same size, and the frame members 50 extend entirely from the left end to the right end of the plate member 40 in the X direction. However, it is not absolutely necessary that the plate member 40 and the liquid crystal panel 11 have the same size, and the plate member 40 may be larger than the liquid crystal panel 11, for example. In addition, the frame members 50 may not necessarily extend entirely in the X direction of the plate member 40, but may extend partly in the X direction, for example. In that case, it is only necessary to provide the first protrusions 41 of the plate member 40 at both end portions in the extending direction the frame members 50.

Figure 20:
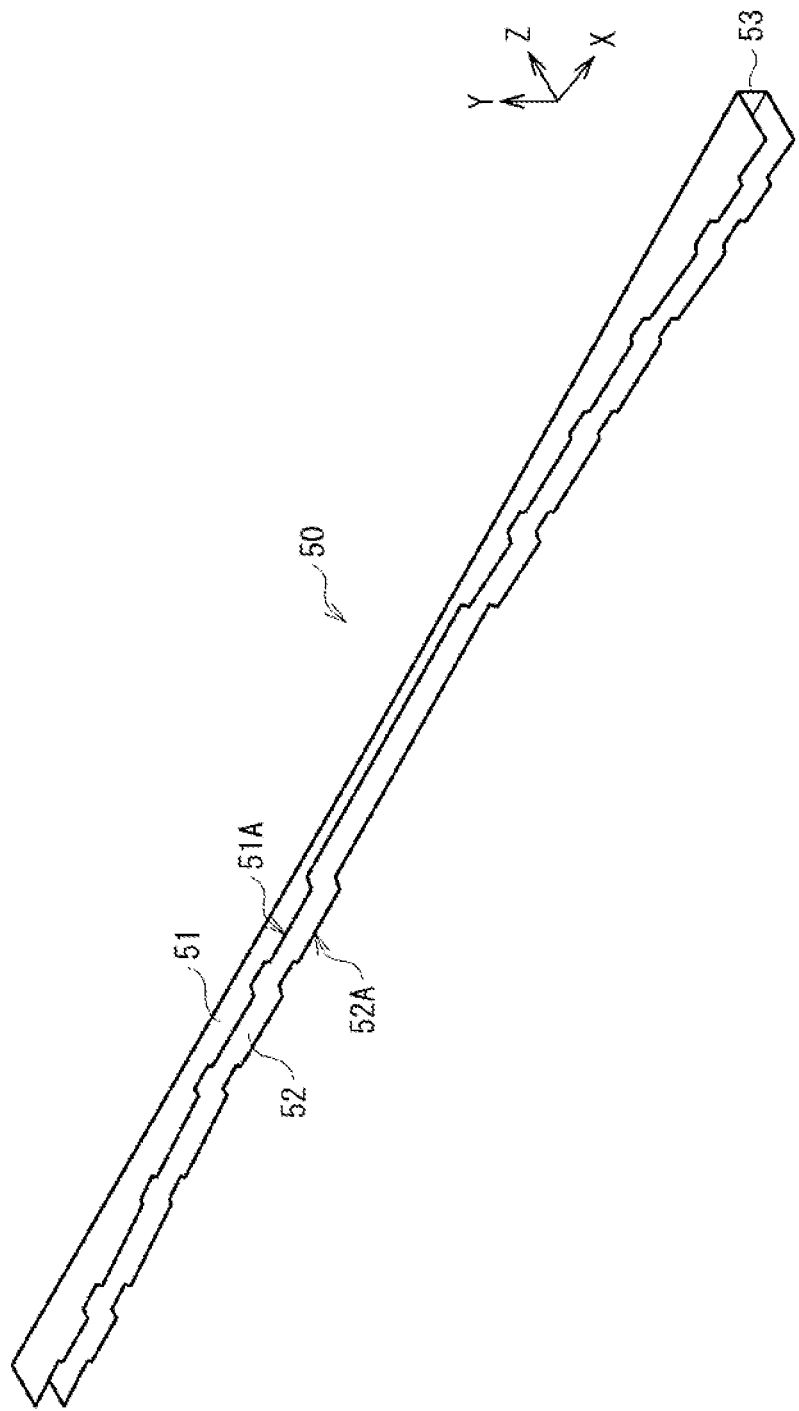
FIG. 20 is a perspective view showing a modification of the frame member illustrated in FIG. 8.
Figure 21:
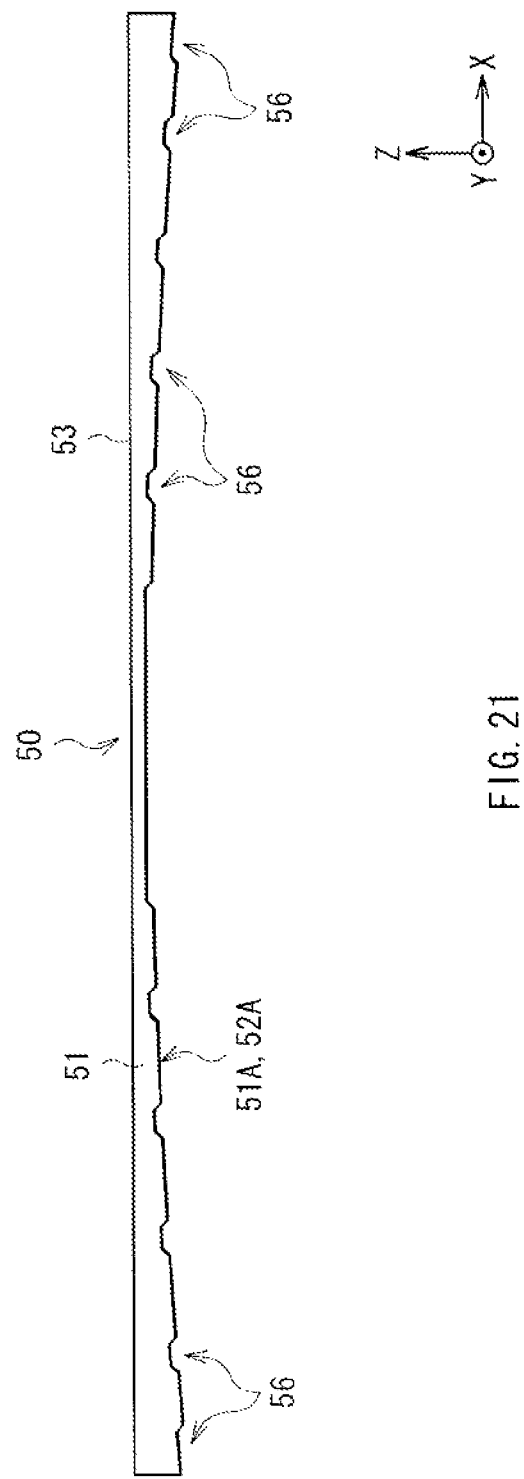
FIG. 21 is a top view showing an example of the frame member illustrated in FIG. 20.

In addition, in the above-mentioned embodiment, a case is described in which the left and right sections 53A and 53B of the side face section 53 of the frame members 50 are bent toward the plate member 40 side as illustrated in FIG. 9. However, the side face section 53 of the frame members 50 may also have a uniform flat face as illustrated in FIG. 20 and FIG. 21.

Further, for example, the fixation of the plate member 40 and the frame members 50 may be performed by other methods without using the bosses 43 illustrated in FIG. 10.

Additionally, while, in the above-mentioned embodiment, a case is described in which the heat releasing plate 39 serves also as a reinforcement structure, a reinforcement plate may be provided separately from the heat releasing plate 39. Such a reinforcement plate may be configured using a material similar to that of the heat releasing plate 39.

Furthermore, while, in the above-mentioned embodiment, a case is described in which the light source 37 is disposed at the left and right sides of the light guide plate 35, the position of the light source 37 is not limited to this, and the light source 37 may be disposed at the upper and lower sides, at one of the left and right sides, or at one of the upper and lower sides of the light guide plate 35. Further, the light source 37 of a back-lit type may be provided without using the light guide plate 35.

On top of that, for example, the materials and thicknesses of the layers described in the above-mentioned embodiment and the modifications are not limitative, and other materials and thicknesses may also be adopted.

Furthermore, for example, while, in the above-mentioned embodiment and the modifications, the configurations of the displays 1 and 2 (television apparatuses) are described in detail, all of the components may not necessary be included, and other components may be further included.

Embodiments of the present disclosure are broadly applicable to, other than the television described in the above-mentioned embodiment, electronic apparatuses in various fields, which display an externally-inputted video signal or an internally-generated video signal as an image or a video. Examples of such electronic apparatuses may include a monitor of a PC (personal computer), a public display, and the like.

Furthermore, the technology encompasses any possible combination of some or all of the various embodiments described herein and incorporated herein.

It is possible to achieve at least the following configurations from the above-described example embodiments of the disclosure.

(1) A display, including:
a plate member having flexibility and including a first face and a second face that face each other;
a frame member provided on the first face of the plate member and extending in one direction of the first face; and
a display body having flexibility and disposed on a side of the plate member on which the second face is provided.

(2) The display according to (1), further including a reinforcement structure extending in a direction different from the extending direction of the frame member.

(3) The display according to (2), wherein the reinforcement structure is provided at both end portions in the extending direction of the frame member.

(4) The display according to (2) or (3), wherein the plate member includes a first protrusion extending in a direction different from the extending direction of the frame member, the first protrusion serving as the reinforcement structure.

(5) The display according to any one of (2) to (4), wherein the display body includes a liquid crystal panel, a light source that illuminates the liquid crystal panel, and a heat releasing plate that dissipates heat derived from the light source and serves as the reinforcement structure.

(6) The display according to any one of (1) to (5), wherein the plate member has a shape, in the extending direction of the frame member, same as a shape of one of a side and a face of the frame member, the side and the face of the frame member facing the plate member, and the display body has a shape same as the shape of the plate member.

(7) The display according to (6), wherein one of the side and the face of the frame member facing the plate member is curved in part or in whole in the extending direction of the frame member.

(8) The display according to (7), wherein one of the side and the face of the frame member facing the plate member has locally-different curvatures in the extending direction of the frame member.

(9) The display according to (6), wherein one of the side and the face of the frame member facing the plate member has a shape of a part of a polygon in the extending direction of the frame member.

(10) The display according to any one of (1) to (9), wherein the plate member includes a plurality of second protrusions disposed in parallel to each other, the second protrusions being arrayed in the extending direction of the frame member and each extending in a direction different from the extending direction of the frame member.

It should be understood by those skilled in the art that various modifications, combinations, sub-combinations and alterations may occur depending on design requirements and other factors insofar as they are within the scope of the appended claims or the equivalents thereof.

What is claimed is:

1. A display, comprising:
a plate member having flexibility and including a first face and a second face that face each other;
a plurality of frame members, each frame member provided on the first face of the plate member and extending in a first direction of the first face; and
a liquid crystal panel having a light source, a heat releasing plate, an optical sheet, a light guide plate and a reflection plate, said liquid crystal panel having flexibility and disposed on a side of the plate member on which the second face is provided,
the plurality of frame members include a first frame member arranged at an upper side of the plate member, a second frame member arranged at a lower side of the plate member, and a third frame member arranged at an intermediate location between the upper side of the plate member and the lower side of the plate member,
the plate member includes a protrusion extending in a second direction which is orthogonal to the first direction, said protrusion having a recessed portion located between the second face of the plate member and the liquid crystal panel,
the plate member having a first end and a second end located at opposite ends of the plate member in the first direction, and said protrusion being provided at a location other than the first end or the second end, and
the heat releasing plate (i) arranged within the recessed portion of said protrusion and configured to extend in the second direction and (ii) configured to dissipate heat generated by the light source and to provide structural reinforcement for the plate member.

2. The display according to claim 1, wherein
the plate member has a shape, in the first direction of the frame members, same as a shape of one of a side and a face of the frame members, the side and the face of the frame members facing the plate member, and
the liquid crystal panel has a shape same as the shape of the plate member.

3. The display according to claim 2, wherein one of the side and the face of the frame members facing the plate member is curved in part or in whole in the first direction of the frame members.

4. The display according to claim 3, wherein one of the side and the face of the frame members facing the plate member has locally-different curvatures in the first direction of the frame members.

5. The display according to claim 2, wherein one of the side and the face of the frame members facing the plate member has a shape of a part of a polygon in the first direction of the frame members.

6. The display according to claim 1, wherein the plate member includes a plurality of second protrusions disposed in parallel to each other, the second protrusions being arrayed in the first direction of the frame members and each extending in the second direction.

7. The display according to claim 1, wherein the plate member includes another protrusion extending in the second direction and having the recessed portion located between the second face of the plate member and the liquid crystal panel, and wherein the liquid crystal panel has another heat releasing plate which is arranged within the recessed portion of the another protrusion and configured to extend in the second direction, to dissipate the heat generated by the light source, and to provide structural reinforcement for the plate member.

8. The display according to claim 7, wherein the another protrusion is provided at the first end or the second end of the plate member.

9. The display according to claim 1, wherein the protrusion is provided at a center of the plate member between the first end and the second end of the plate member.

10. A display comprising:
a liquid crystal panel assembly having a light source, a heat releasing plate, a liquid crystal cell, an optical sheet, a light guide plate and a reflection plate, said liquid crystal panel assembly having a display side for viewing images which substantially extends in an up-down direction and a right-left direction, and said liquid crystal panel assembly having a curved shape in a plane defined by the right-left direction and a thickness direction, in which the up-down direction, the right-left direction and the thickness direction are orthogonal to each other;
a plate member having a front face and a back face, said plate member being separate from the liquid crystal panel assembly and having the curved shape of the liquid crystal panel assembly; and
a plurality of frame members, each frame member provided on the back face of the plate member and extending in the right-left direction;

the liquid crystal panel assembly being disposed on the front face of the plate member, and the plurality of frame members include a first frame member arranged at an upper portion in the up-down direction of the back face of the plate member, a second frame member arranged at a lower portion in the up-down direction of the back face of the plate member, and a third frame member arranged at an intermediate location in the up-down direction between the upper portion and the lower portion of the back face of the plate member, the plate member includes a protrusion extending in the up-down direction, said protrusion having a recessed portion located between the front face of the plate member and the liquid crystal panel assembly, the plate member having a first end and a second end located at opposite ends of the plate member in the first direction, and said protrusion being provided at a location other than the first end or the second end, and the heat releasing plate (i) arranged within the recessed portion of said protrusion and configured to extend in the up-down direction and (ii) configured to dissipate heat generated by the light source and to provide structural reinforcement for the plate member.

11. The display according to claim 10, in which the liquid crystal cell, the optical sheet, the light guide plate and the reflection plate of the liquid crystal panel are arranged in this order in the thickness direction.

12. The display according to claim 11, in which the reflection plate of the liquid crystal panel is disposed on the front face of the plate member.

\* \* \* \* \*